United States Patent [19]
Ohta

[11] Patent Number: 5,995,412
[45] Date of Patent: Nov. 30, 1999

[54] NONVOLATILE SEMICONDUCTOR STORAGE DEVICE AND WRITING METHOD THEREOF

[75] Inventor: Yoshiji Ohta, Kashiwara, Japan

[73] Assignee: Sharp Kabushiki Kaisha, Osaka, Japan

[21] Appl. No.: 09/167,192

[22] Filed: Oct. 6, 1998

[30] Foreign Application Priority Data

Oct. 7, 1997 [JP] Japan ................................ 9-274270

[51] Int. Cl.$^6$ ............................. G11C 16/04; G11C 16/06
[52] U.S. Cl. ................................ 365/185.03; 365/185.22
[58] Field of Search ........................... 365/185.03, 185.2, 365/185.22, 201

[56] References Cited

U.S. PATENT DOCUMENTS 5,818,753  10/1998  Gotou ................................ 365/185.03

FOREIGN PATENT DOCUMENTS 0 760 516  3/1997  European Pat. Off. .

OTHER PUBLICATIONS

1996 IEEE International Solid–State Circuits Conference, ISSCC96/Session 2/Flash Memory/Paper TP2.1, "A 3.3 128Mb Multi–Level NAND Flash Memory for Mass Storage Applications", Tae–Sung Jung et al., Samsung Electronics Co., Ltd., Kiheung, Korea, Feb. 8, 1996, pp. 32–33.

T–S Jung et al, "A 117–mm$^2$ 3.3V Only 128–Mb Multilevel NAND Flash Memory For Mass Storage Applications", IEEE Journal of Solid–State Circuits, vol. 31, No. 11, Nov. 1996, pp. 1575–1583.

*Primary Examiner*—David Nelms
*Assistant Examiner*—Anh Phung
*Attorney, Agent, or Firm*—Morrison & Foerster LLP

[57] ABSTRACT

A nonvolatile semiconductor storage device and writing method thereof are capable of concurrently executing a write operation and a verify operation of multi-value data into a plurality of memory cells and writing multi-value data at high speed. Latch circuits of Latch0 and Latch1 store an input multi-value data to be written into a memory cell selected by a bit line and a word line. Multi-value sense amplifiers read the multi-value data written in the memory cell. Based on the input multi-value data (latch nodes Q0#, Q1#) stored in the latch circuits of Latch0 and Latch1 and the multi-value data (sense nodes S0#, S1#) read from the memory cell by the multi-value sense amplifiers, a bit line voltage generating circuit applies a specified voltage for writing the input multi-value data into the memory cell to the bit line connected to the memory cell.

4 Claims, 7 Drawing Sheets

INFORMATION "0,0"
Voltage of Input
Nodes S0,S0#

INFORMATION "0,0"
Voltage of Input
Nodes S1,S1#

INFORMATION "0,1"
Voltage of Input
Nodes S0,S0#

INFORMATION "0,1"
Voltage of Input
Nodes S1,S1#

INFORMATION "1,0"
Voltage of Input
Nodes S0,S0#

INFORMATION "1,0"
Voltage of Input
Nodes S1,S1#

INFORMATION "1,1"
Voltage of Input
Nodes S0,S0#

INFORMATION "1,1"
Voltage of Input
Nodes S1,S1#

NONVOLATILE SEMICONDUCTOR STORAGE DEVICE AND WRITING METHOD THEREOF

BACKGROUND OF THE INVENTION

The present invention relates to a nonvolatile semiconductor storage device for writing parallel multi-value data into a plurality of memory cells.

The nonvolatile semiconductor storage devices have made a remarkable progress in recent years, and their storage capacities are rapidly increasing. Accordingly, as a method for increasing the storage capacity through the same manufacturing processes as those of the prior art, there is the method of increasing the number of bits of information that can be stored in one memory cell (i.e., providing the so-called multi-value structure). In this multi-value nonvolatile semiconductor storage device, the threshold voltage of each memory cell is controlled. In the above nonvolatile semiconductor storage device, four values (two bits per cell in terms of the amount of information) are stored into one memory cell, and the values are made to be "0, 0", "0, 1", "1, 0" and "1, 1" in descending order of the threshold voltage of the memory cell. Assuming that the data "0, 0" represents an erased state, then a write operation is executed by shifting the threshold voltage of the memory cell in this erased state to the lower threshold voltages in order of the data "0, 1", "1, 0" and "1, 1". Although there is also a nonvolatile semiconductor storage device wherein the threshold voltage of the memory cell from which data has been erased is lower than the threshold voltage of the memory cell into which data has been written, it is essentially the same.

As a nonvolatile semiconductor storage device for writing such multi-value data, there has been proposed one which independently operates a write operation and a verify operation in the order of, for example, "0, 1", "1, 0" and "1, 1" ("A 3.3V 128 Mb Multi-Level NAND Flash Memory for Mass Storage Applications" ISSCC96 DIGEST OF TECHNICAL PAPERS P32–P33).

However, the above nonvolatile semiconductor storage device has the following problems (1) through (4).

(1) Since the verify operation is executed every multi-value data, the time necessary for this verify operation is prolonged to be about three times that in the case of binary value when, for example, four-value data is stored into one memory cell.

(2) Since a word line voltage at the time of the write and verify operations must be varied in accordance with the threshold voltage of the multi-value data to be verified, a time for varying the word line voltage is necessary.

(3) Since the voltage applied to the bit line is constant regardless of the value of the multi-value data in the write stage and a voltage that ranges from a negative voltage of a small absolute value for the data "0, 1" to a negative voltage of a large absolute value for the data "1, 1" is applied to the word line, many write pulses are necessary.

(4) There is caused gate disturbance of the memory cells commonly connected to an identical word line.

SUMMARY OF THE INVENTION

Accordingly, the object of the present invention is to provide a nonvolatile semiconductor storage device and writing method thereof capable of concurrently executing a write operation and a verify operation of multi-value data into a plurality of memory cells and writing multi-value data at high speed.

In order to achieve the above-mentioned object, the present invention provides a nonvolatile semiconductor storage device comprising: a plurality of non-volatile memory cells connected to bit lines and word lines; a latch circuit for storing therein input multi-value data to be written into a memory cell selected by a bit line and a word line; a multi-value sense amplifier for reading multi-value data written in the memory cell by applying a specified read voltage to the word line; and a bit line voltage generating circuit for, based on the input multi-value data stored in the latch circuit and the input multi-value data read from the memory cell by the multi-value sense amplifier, applying a specified voltage for writing the input multi-value data into the memory cell to the bit line connected to the memory cell.

In this nonvolatile semiconductor storage device, by storing input multi-value data to be written into the memory cell selected by the bit line and the word line into the latch circuit and applying a specified read voltage to the word line, the multi-value data written in the memory cell is read by the multi-value sense amplifier. Then, on the basis of the input multi-value data stored in the latch circuit and the multi-value data that has been read by the multi-value sense amplifier and written into the memory cell, a specified voltage for writing the input multi-value data into the memory cell by the bit line voltage generating circuit is applied to the bit line connected to the memory cell, and thereafter a specified write voltage is applied to the word line, thereby writing the input multi-value data into the memory cell. As described above, the multi-value data of a plurality of memory cells can be read at once by the multi-value sense amplifier, and this obviates the need for executing the verify operation every data and allows the multi-value sense amplifier to read the multi-value data from the memory cell with the specified word line voltage. Accordingly, there is no need for varying the word line voltage during the verify operation. Furthermore, the specified voltage can be applied every bit line by the bit line voltage generating circuit, and therefore, the number of write pulses can be optimized, thereby allowing the multi-value data to be written in a small number of times of writing. Therefore, the write operation and the verify operation of multi-value data can be concurrently executed on a plurality of memory cells. Furthermore, the specified voltage is applied to the word line regardless of the values of the multi-value data to be written, and therefore, the gate disturbance can be reduced.

In one embodiment, when the input multi-value data stored in the latch circuit coincides with a value based on the multi-value data read from the memory cell by the multi-value sense amplifier by the reading from the memory cell, the voltage application to the bit line by the bit line voltage generating circuit and the writing into the memory cell, the bit line voltage generating circuit puts the bit line of the selected memory cell into an open state. Therefore, even when the writing into another memory cell connected to the same word line is executed, the memory cell in which the input multi-value data has been correctly written is not further subjected to the write operation, and therefore, the input multi-value data can be infallibly written into the memory cell.

In one embodiment, the bit line voltage generating circuit continues to output the specified voltage for writing the input multi-value data into the memory cell until the input multi-value data is correctly written into the memory cell and the input multi-value data stored in the latch circuit coincides with a value based on the multi-value data read from the memory cell by the multi-value sense amplifier by the reading from the memory cell, the voltage application to the bit line by the bit line voltage generating circuit and the writing into the memory cell. Therefore, when the operations of the reading from the memory cell, the voltage application to the bit line by the bit line voltage generating circuit and the writing into the memory cell are repeated, there is no delay of output of the bit line voltage generating circuit as compared with the one that switches between write pulses, thereby allowing a high-speed write time to be achieved.

The present invention provides a writing method for a nonvolatile semiconductor storage device having a plurality of non-volatile memory cells connected to bit lines and word lines, the method comprising: a first step of storing an input multi-value data to be written to a memory cell selected by a bit line and a word line into latch circuits; a second step of reading a multi-value data written in the memory cell by the multi-value sense amplifiers by applying a specified read voltage to the word line; a third step of, based on the input multi-value data stored in the latch circuits and the multi-value data written in the memory cell read by the multi-value sense amplifiers, applying a specified voltage for writing the input multi-value data into the memory cell by a bit line voltage generating circuit to the bit line connected to the memory cell; and a fourth step of writing the input multi-value data into the memory cell by applying a specified write voltage to the word line in a state in which the specified voltage is applied to the bit line by the bit line voltage generating circuit, the second, third and fourth steps being repeated until the input multi-value data stored in the latch circuits coincides with a value based on the multi-value data read from the memory cell by the multi-value sense amplifiers.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The nonvolatile semiconductor storage device and writing method thereof according to the present invention will be described in detail below based on the embodiments shown in the accompanying drawings.

Figure 1:
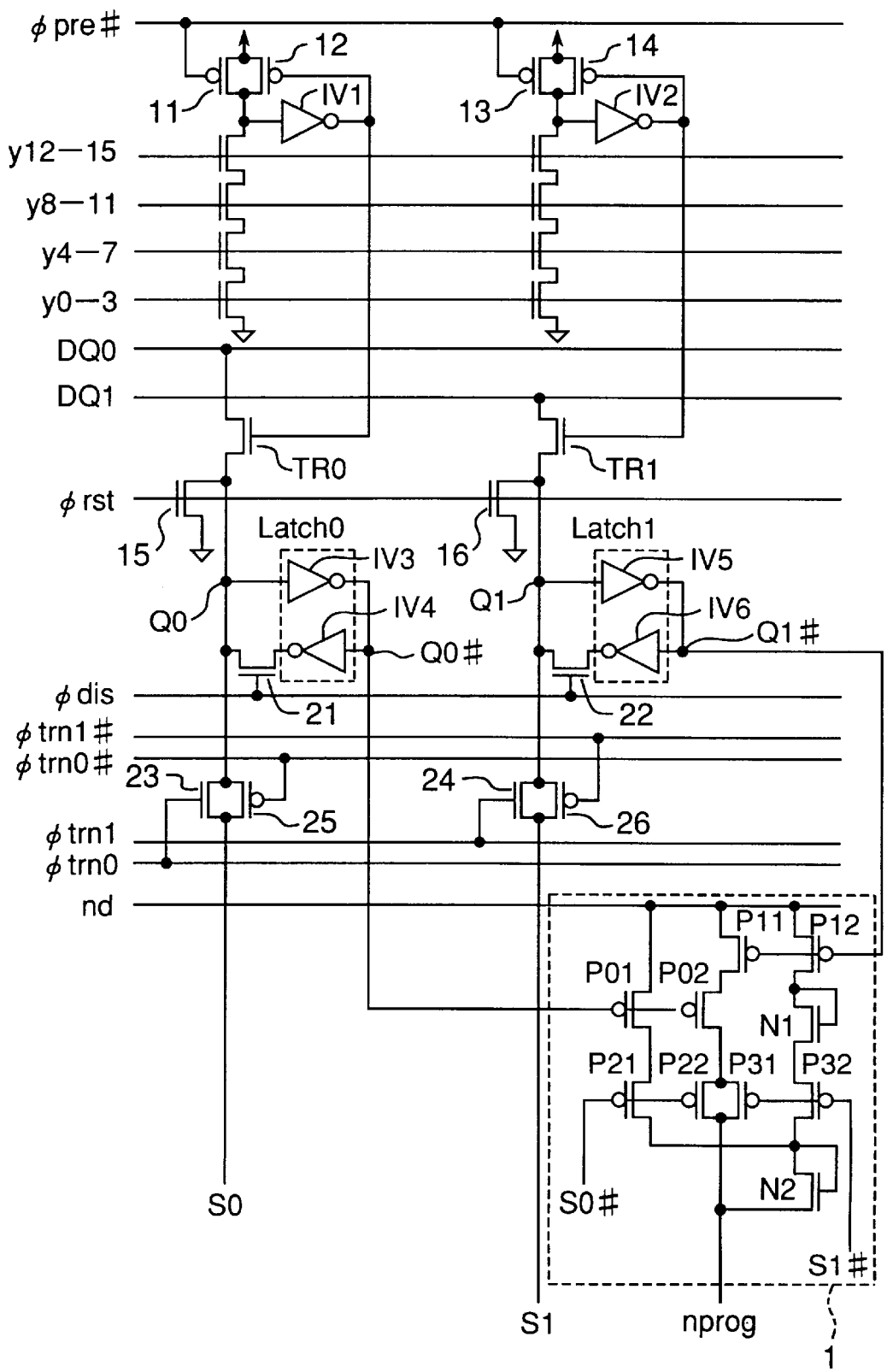
FIG. 1 is a circuit diagram of a latch circuit, a bit line voltage generating circuit and their peripheries of a nonvolatile semiconductor storage device according to an embodiment of the present invention.
Figure 2:
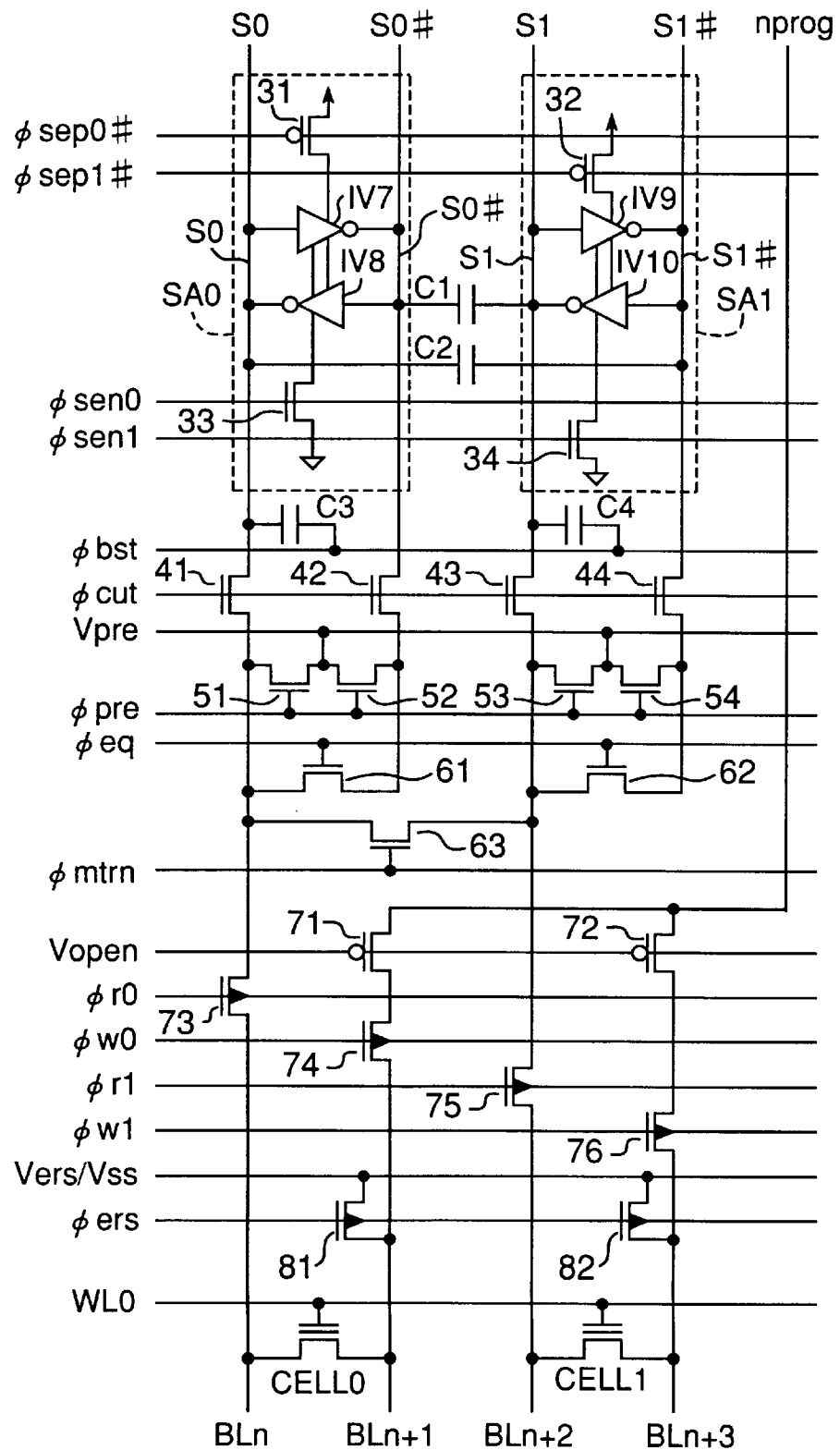
FIG. 2 is a circuit diagram of a sense amplifier, a memory cell and their peripheries of the above nonvolatile semiconductor storage device continued from FIG. 1.

FIG. 1 and FIG. 2 are circuit diagrams of a nonvolatile semiconductor storage device according to an embodiment of the present invention. FIG. 1 shows a circuit diagram of the peripheries of a bit line voltage generating circuit 1, while FIG. 2 shows a circuit diagram of a multi-value sense amplifier, a memory cell and their peripheries continued from FIG. 1. In this nonvolatile semiconductor storage device, a 4-value (2-bit) data is to be stored into one memory cell, thereby making the data of "00", "01", "10" and "11" in descending order of a threshold voltage Vth at which a current starts to flow through the memory cell.

In this nonvolatile semiconductor storage device, if a column is selected by internal column addresses y12–15, y8–11, y4–7 and y0–3 in a state in which input terminals of inverters IV1 and IV2 are pre-charged with a power voltage Vcc via p-channel transistors 11 and 13 whose gates are connected to a pre-charge signal φpre#, then the input terminals of the inverters IV1 and IV2 come to have Low-level. Then, output terminals of the inverters IV1 and IV2 come to have High-level, by which n-channel transistors TR0 and TR1 are turned on to connect data lines DQ0 and DQ1 to latch nodes Q0 and Q1 of latch circuits Latch0 and Latch1 via the n-channel transistors TR0 and TR1. The latch nodes Q0 and Q1 of the latch circuits Latch0 and Latch1 are connected to the ground GND via n-channel transistors 15 and 16.

The latch circuit Latch0 has inverters IV3 and IV4 whose input terminals are connected to the output terminals of the counterparts, the input terminal side of the inverter IV3 serving as a latch node Q0 and the input terminal side of the inverter IV4 serving as a latch node Q0#. The latch circuit Latch1 has inverters IV5 and IV6 whose input terminals are connected to the output terminals of the counterparts, the input terminal side of the inverter IV5 serving as a latch node Q1 and the input terminal side of the inverter IV6 serving as a latch node Q1#. The input terminal of the inverter IV3 and the output terminal of the inverter IV4 are connected to each other via an n-channel transistor 21 whose gate is connected to a disable signal φdis. The input terminal of the inverter IV5 and the output terminal of the inverter IV6 are connected to each other via an n-channel transistor 22 whose gate is connected to the disable signal φdis. The latch node Q0 of the latch circuit Latch0 is connected to a sense node S0 of a sense amplifier SA0 shown in FIG. 2 via a p-channel transistor 25 whose gate is connected to a data transfer signal φtrn0#. The p-channel transistor 25 is connected in parallel with an n-channel transistor 23 whose gate is connected to a data transfer signal φtrn0. The latch node Q1 of the latch circuit Latch1 is connected to a sense node S1 of the sense amplifier SA1 shown in FIG. 2 via a p-channel transistor 26 whose gate is connected to a data transfer signal φtrn1#. The p-channel transistor 26 is connected in parallel with an n-channel transistor 24 whose gate is connected to a data transfer signal φtrn1.

The latch node Q0# of the latch circuit Latch0 is connected to the gates of p-channel transistors P01 and P02, and the drain of the p-channel transistor P01 is connected to a bit line voltage supply line nd. The latch node Q1# of the latch circuit Latch1 is connected to the gates of p-channel transistors P11 and P12, and the drains of the p-channel transistors P11 and P12 are connected to the bit line voltage supply line nd. The drain of the p-channel transistor P02 is connected to the source of the p-channel transistor P11. The sense node S0# of the sense amplifier SA0 shown in FIG. 2 is connected to the gates of p-channel transistors P21 and P22, the source of the p-channel transistor P01 is connected to the drain of the p-channel transistor P21, and the source of the p-channel transistor P02 is connected to the drain of the p-channel transistor P32. Further, the sense node S1# of the sense amplifier SA1 shown in FIG. 2 is connected to the gates of p-channel transistors P31 and P32. The p-channel transistor P31 is connected in parallel with the p-channel transistor P22. The source of the p-channel transistor P12 is connected to the drain of the n-channel transistor N1 whose gate and drain are connected to each other, while the source of the n-channel transistor N1 is connected to the drain of the p-channel transistor P32. Further, the source of the p-channel transistor P21 and the source of the p-channel transistor P32 are connected to the drain of the n-channel transistor N2 whose gate and drain are connected to each other. The source of the n-channel transistor N2 is connected to the sources of the p-channel transistors P22 and P31. The p-channel transistors P01, P02, P11, P12, P21, P22, P31 and P32 and the n-channel transistors N1 through N2 constitute the bit line voltage generating circuit 1. The source of the n-channel transistor N2 is made to serve as an output node nprog of the bit line voltage generating circuit 1.

As shown in FIG. 2, the sense node SO of the sense amplifier SA0 having inverters IV7 and IV8 whose input terminals are connected to the output terminals of the counterparts is connected to a bit line BLn via an n-channel transistor 41, and the bit line BLn is connected to the drain of the memory cell CELL0. The sense node S1 of the sense amplifier SA1 having inverters IV9 and IV10 whose input terminals are connected to the output terminals of the counterparts is connected to a bit line BLn+2 via an n-channel transistor 43, and the bit line BLn+2 is connected to the drain of the memory cell CELL1. A bit line disconnecting signal φcut is connected to the gates of n-channel transistors 41 and 43. The bit line BLn is connected to an n-channel transistor 73 whose gate is connected to a bit line read signal φr0, while the bit line BLn+2 is connected to an n-channel transistor 75 whose gate is connected to a bit line read signal φr1. The sense amplifiers SA0 and SA1, the boost circuits C1, C2, C3 and C4, the p-channel transistors 31 and 32 and the n-channel transistors 33 and 34 constitute a multi-value sense amplifier.

The sense node S0# of the sense amplifier SAO is connected to the bit line BLn via an n-channel transistor 42 whose gate is connected to the bit line disconnecting signal φcut and an n-channel transistor 61 whose gate is connected to a bit line equalizing signal φeq.

A pre-charge voltage Vpre is connected to the bit lines BLn and BLn+2 via n-channel transistors 51 and 53 whose gates are connected to the bit line pre-charge signal φpre. The pre-charge voltage Vpre is connected between n-channel transistors 42 and 61 via an n-channel transistor 52 whose gate is connected to the bit line pre-charge signal φpre. The pre-charge voltage Vpre is connected between n-channel transistors 44 and 62 via an n-channel transistor 54 whose gate is connected to the bit line pre-charge signal φpre.

Further, the bit line BLn and the bit line BLn+2 are connected to each other via an n-channel transistor 63 whose gate is connected to a multi-value sense data transfer signal φmtrn. By turning on the n-channel transistor 63, the memory cell CELL0 can be read by the sense amplifier SA1.

The output node nprog of the bit line voltage generating circuit 1 shown in FIG. 1 is connected to the source of the memory cell CELL0 via a p-channel transistor 71 whose gate is connected to a bit line open signal Vopen and an n-channel transistor 74 whose gate is connected to a bit line write signal φw0. The output node nprog is connected to the source of the memory cell CELL1 via a p-channel transistor 72 whose gate is connected to the bit line open signal Vopen and an n-channel transistor 76 whose gate is connected to a bit line write signal φw1.

The sense node S0# of the sense amplifier SA0 and the sense node S1 of the sense amplifier SA1 are connected to each other via a boost circuit C1 constructed of a capacitive element. The sense node S0 of the sense amplifier SA0 and the sense node S1# of the sense amplifier SA1 are connected to each other via a boost circuit C2 constructed of a capacitive element. Further, a boost signal φbst is connected to the sense node S0 of the sense amplifier SA0 via a boost circuit C3 constructed of a capacitive element, while the boost signal φbst is connected to the sense node S1 of the sense amplifier SA1 via a boost circuit C4 constructed of a capacitive element.

In this case, assuming that the sense sensitivity of the sense amplifiers SA0 and SA1 is $\Delta V$, then the boost circuits C3 and C4 increase by $3\Delta V$ the voltages at the input nodes S0 and S1 on the voltage sense side of the sense amplifiers SA0 and SA1. In contrast to this, the boost circuit C2 increases by $2\Delta V$ the voltage at the input node S1# on the reference side of the sense amplifier SA1 when the voltage at the input node S0 is increased. Likewise, the boost circuit C1 increases by $2\Delta V$ the voltage at the input node S1 on the voltage sense side of the sense amplifier SA1 when the voltage at the input node S0# is increased.

It is to be noted that n-channel transistors 81 and 82 the gates of which are connected to an erase signal hers shown in FIG. 2 and the drains of which are connected to an erase voltage Vers/Vss are used in erasing the data in the memory cells, and no description is provided herein for them.

In the nonvolatile semiconductor storage device constructed as above, by applying a voltage via the word line WL0 to the gate of the transistor constituting the memory cell CELL0, the stored multi-value data are subjected to a decision depending on whether or not a current flows. In this case, it is assumed that the selected memory cell is CELL0, and a read pulse (constant voltage) and a write pulse (constant voltage) are applied to the word line WL0.

Figure 3:
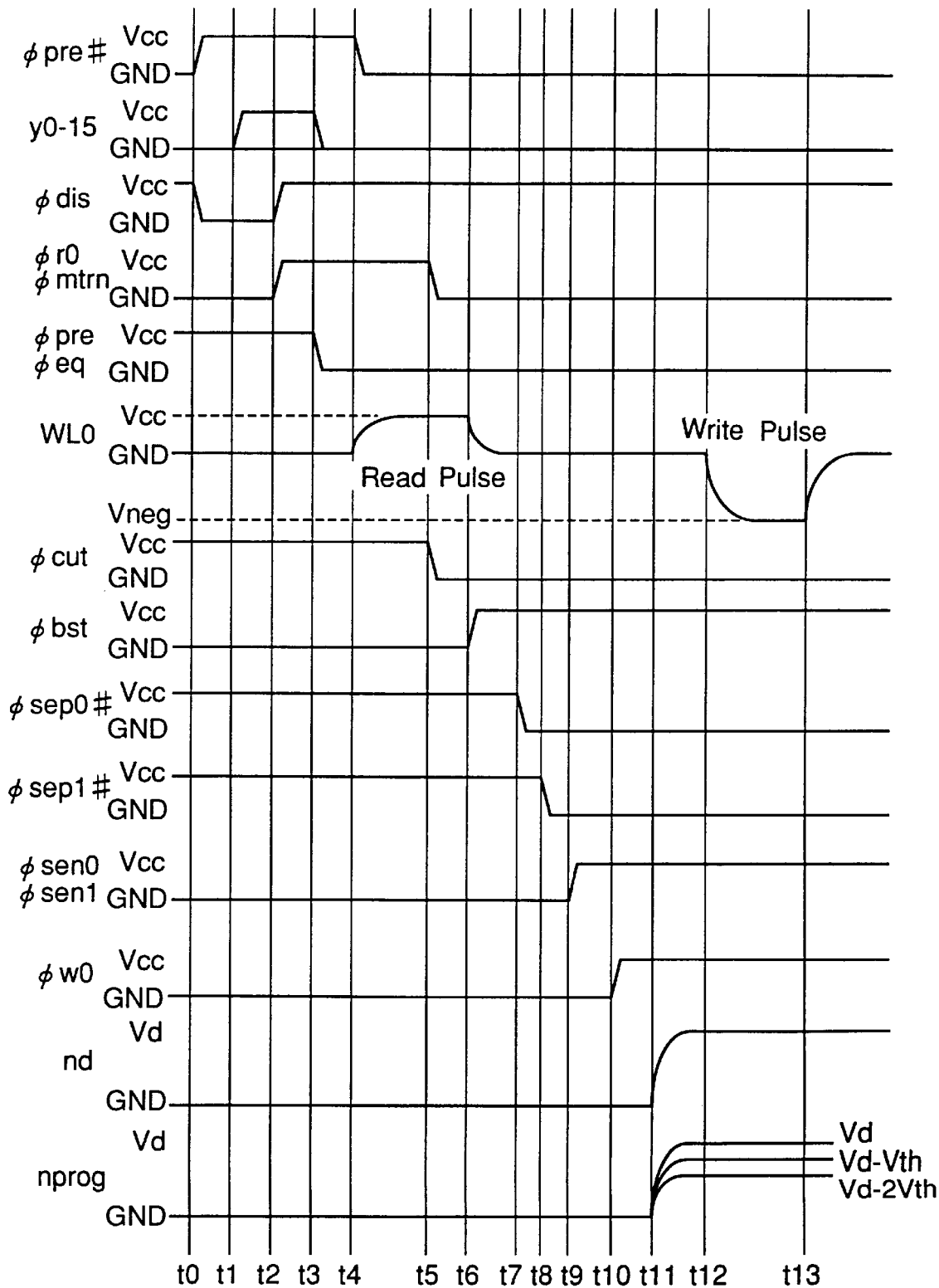
FIG. 3 is a timing chart in the writing stage of the above nonvolatile semiconductor storage device.

The write operation and the verify operation will be described below with reference to the timing charts of FIG. 3 and FIG. 4. In this case, the pre-charge signal φpre is at the level of the ground GND, and the n-channel transistors TR0 and TR1 are turned off. The n-channel transistors 15 and 16 are turned on by setting the level of the disable signal φdis to the power voltage Vcc and setting a reset signal φrst to High-level, thereby resetting the latch circuits Latch0 and Latch1. The bit line pre-charge signal φpre and the bit line equalizing signal φeq are set to High-level, thereby charging the bit lines BLn through BLn+3 with the pre-charge voltage Vpre.

(1) Loading input multi-value data

First, 2-bit input multi-value data is given to data lines DQ0 and DQ1, and the pre-charge signal φpre# is made to have High-level at a time point t0. The disable signal φdis is made to have Low-level and thereafter the internal column addresses y0–y15 are determined at the point t1. Then, the column selecting transistors TR0 and TR1 are turned on to load the latch circuits Latch0 and Latch1 with the data on the data lines DQ0 and DQ1.

Then, at a time point t3, the disable signal φdis is made to have High-level to latch the data on the data lines DQ0 and DQ1 thereby restoring the internal column address signals y0–y15 into their original states, and the pre-charge signal φpre# is set back to the Low-level at a time point t4 thereby turning off the column selecting transistors TR0 and TR1.

(2) Reading from memory cell

Next, at a time point t2 when the latch circuits Latch0 and Latch1 are loaded with the input multi-value data, the bit line read signal φr0 and the multi-value sense data transfer signal φmtrn are made to have High-level to select the bit line BLn of the memory cell CELL0, and thereafter, the bit line pre-charge signal φpre and the bit line equalizing signal φeq are made to have Low-level at the time point t3, thereby stopping the pre-charging of the bit line BL.

Next, the word line WL0 is made to rise to High-level at a time point t4, the bit line disconnecting signal φcut, the multi-value sense data transfer signal φmtrn and the bit line read signal φfr0 are made to have Low-level at a time point t5 after a lapse of a specified time, thereby disconnecting the sense nodes S0 and S1 from the bit line BLn.

Subsequently, the boost signal 100bst is made to have High-level at a time point t6 to boost the sense nodes S0 and S1, and the p-channel sense signal φsep0# is made to have Low-level at a time point t7 to operate the sense amplifier SA0. During the time points t4 through t6, the read pulse is applied to the word line WL0.

At a time point t8 after a lapse of several nanoseconds, a p-channel sense signal φsep1# is made to have Low-level to operate the sense amplifier SA1, and thereafter, n-channel sense signals φsen0 and φsen1 are made to have High-level at a time point t9 to determine the sense result.

Figure 4A:
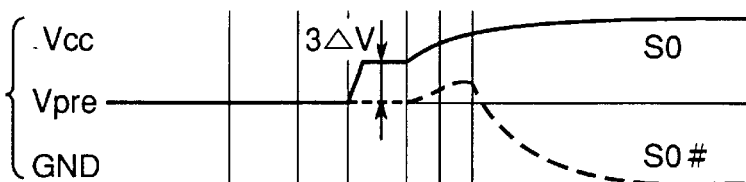
FIG. 4A, 4B, 4C 4D, 4E, 4F, 4G and 4H are charts showing a variation in voltage at each input node in the writing stage shown in FIG. 3.
Figure 4B:
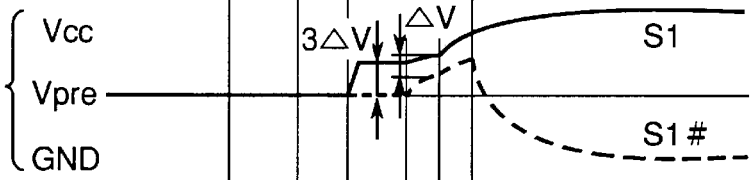

If the memory cell CELL0 is in the erased state (information "0, 0") in this stage, then both the sense nodes S0 and S1 come to have High-level as shown in FIGS. 4A and 4B, and the sense nodes S0# and S1# are both made to have Low-level.

Figure 4C:
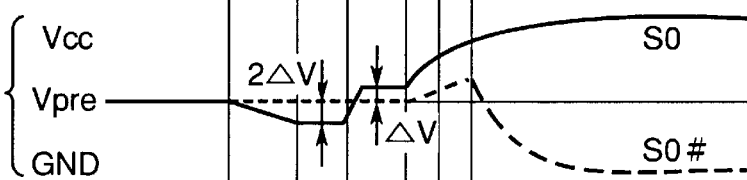
Figure 4D:
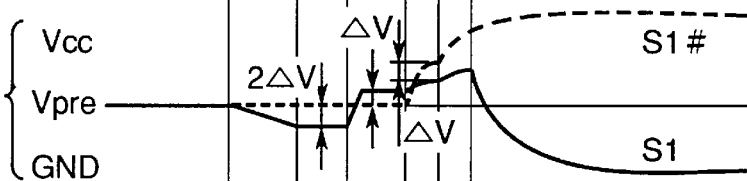

If the information written in the memory cell CELL0 is "0, 1", as shown in FIGS. 4C and 4D, then the sense node S0 comes to have High-level, the sense node S0# comes to have Low-level, the sense node S1 comes to have Low-level and the sense node S1# comes to have High-level.

Figure 4E:
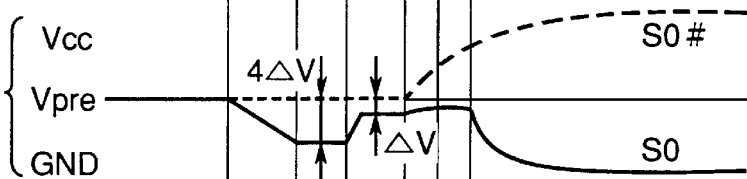
Figure 4F:
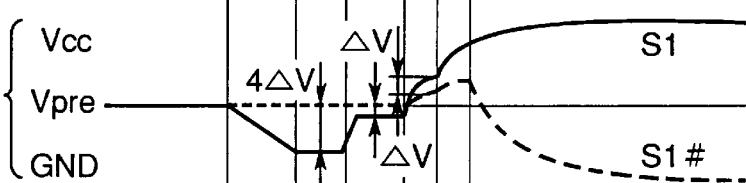

If the information written in the memory cell CELL0 is "1, 0", as shown in FIGS. 4E and 4F, then the sense node S0 comes to have Low-level, the sense node S0# comes to have High-level, the sense node S1 comes to have High-level and the sense node S1# comes to have Low-level.

Figure 4G:
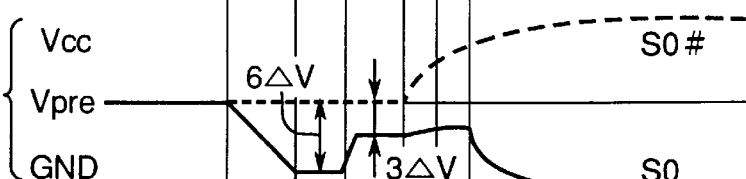
Figure 4H:
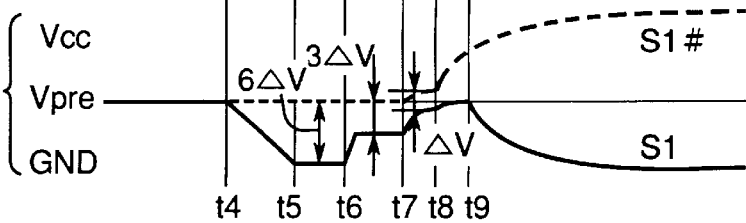

If the information written in the memory cell CELL0 is "1, 1", as shown in FIGS. 4G and 4H, then the sense node S0 comes to have Low-level, the sense node S0# comes to have High-level, the sense node S1 comes to have Low-level and the sense node S1# comes to have High-level.

Then, the word line WL0 is set back to the GND level (this operation can be executed at any time after the bit line is cut off from the sense node) although not shown. In reading the memory cell CELL0, the bit line BLn+2 is at the GND level.

Reading of the information retained in the memory cell CELL0 will be described in detail below. The buffers IV7 through IV10 constituting the sense amplifiers SA0 and SA1 are constructed of a p-channel transistor and a n-channel transistor that are complementarily connected to each other, although not shown.

First, the memory cell CELL0 is selected, by which the voltages at the input nodes S0 and S1 of the sense amplifiers SA0 and SA1 are reduced from the pre-charge voltage Vpre by a voltage corresponding to the information retained in the selected memory cell CELL0, and thereafter, the voltages at the input nodes S0 and S1 are boosted by ½ (3ΔV) of the maximum discharge voltage by the operations of the boost circuits C3 and C4. Then, only the p-channel transistor (not shown) of the sense amplifier SA0 is operated. Then, in the case where voltage at input node S0>voltage at input node S1, the voltage at the input node S1# on the reference side of the sense amplifier SA1 is boosted by 2ΔV by the operation of the boost circuit C2. In the case where voltage at input node S0<voltage at input node S1, the voltage at the input node S1 on the voltage sense side of the sense amplifier SA1 is boosted by 2ΔV by the operation of the boost circuit C1. Subsequently, by operating the p-channel transistor (not shown) of the sense amplifier SA1 and operating the n-channel transistor (not shown) of the sense amplifiers SA0 and SA1, the information of "00", "01", "10" and "11" of the memory cell CELL0 are discriminated.

(3) Applying voltage to bit line

Next, the bit line write signal φw0 is made to have a High-level at a time point t10 to select the memory cell CELL0, thereby applying a voltage Vd (representative value: 6 V) to the bit line voltage supply line nd. Then, as shown in Table 1, depending on the states of the latch nodes Q0# and Q1# and the sense nodes S0# and S1#, the output node nprog of the bit line voltage generating circuit 1 comes to have a specified voltage or put into the open state.

TABLE 1

| Write Data | Q0# | Q1# | S0# | S1# | nprog |
|---|---|---|---|---|---|
| 0 | 1 | 1 | 0 | 0 | Open |
| 1 | 1 | 0 | 0 | 0 | Vd-2Vth |
|   |   |   | 0 | 1 | Open |
| 2 | 0 | 1 | 0 | 0 | Vd-Vth |
|   |   |   | 0 | 1 |   |
|   |   |   | 1 | 0 | Open |
| 3 | 0 | 0 | 0 | 0 | Vd |
|   |   |   | 0 | 1 |   |
|   |   |   | 1 | 0 |   |
|   |   |   | 1 | 1 | Open |

The threshold voltage Vth in Table 1 represents the threshold voltages of the n-channel transistors N1 and N2 shown in FIG. 1. As shown in Table 1, the output node nprog is in the open state in the case of write data "0, 0", the output node nprog is (Vd–2Vth) in the case of data "0, 1", the output node nprog is (Vd–Vth) in the case of data "1, 0" and the output node nprog is (Vd=6 V) in the case of data "1, 1". The voltage at the output node nprog is applied to the bit line BLn+1 connected to the memory cell CELL0.

(4) Applying write pulse

By applying a write pulse of a negative voltage Vneg (representative value: –9 V) to the word line WL0 for a specified time (representative value: 1 μsec) from a time point t12 to t13, the threshold voltage Vth of the memory cell CELL0 is lowered. In this case, a specified voltage (at output node nprog) is applied to the bit line BLn+1 of the memory cell CELL0, thereby extracting electrons from the floating gate of the memory cell CELL0 to the bit line BLn+1.

(5) Write operation and verify operation

Then, the operation flow returns to (2) "reading from memory cell" and the operations of (2) "reading from memory cell" to (4) "applying write pulse" are repeated until the writing of the memory cell CELL0 ends, i.e., until the values of the latch node Q0# and the sense node S0 coincide with each other and the values of the latch node Q1# and the sense node S1 coincide with each other.

The reason why the values of the latch node Q0# and the sense node S0 are compared with each other and the values of the latch node Q1# and the sense node S1 are compared with each other is that the externally inputted 2-bit input data is inverted with respect to the output data which the memory cell has sensed.

Thus, the voltage is continuously applied to the bit line until the data are correctly written into the memory cell, thereby executing the write operation and the verify operation. When the multi-value data are correctly written into the memory cell, the bit line is put into the open state, when no voltage is applied to the bit line.

In the nonvolatile semiconductor storage device shown in FIG. 1 and FIG. 2, the sense amplifier SA1 constituting the multi-value sense amplifier is concurrently used for the memory cells CELL0 and CELL1, and therefore, the write operation and the verify operation are executed parallel on the even-number or the odd-number of memory cells. However, by providing a multi-value sense amplifier for each memory cell, the write operation and the verify operation can be executed parallel on all the memory cells connected to the same word line.

As described above, the above nonvolatile semiconductor storage device can at once read the multi-value data of the plurality of memory cells connected to the same word line by the multi-value sense amplifiers constructed of the sense amplifiers SA0 and SA1, the boost circuits C1, C2, C3 and C4, the p-channel transistors 31 and 32 and the n-channel transistors 33 and 34. Therefore, this arrangement obviates the need for executing a verify operation on each piece of data, and by applying the specified read voltage to the word line, the multi-value sense amplifier is not required to change the word line voltage during the verify operation since the multi-value data can be read from the memory cell. Furthermore, the specified voltage can be applied to each bit line by the bit line voltage generating circuit 1, and therefore, the number of write pulses can be optimized, thereby allowing the multi-value data to be written in a small number of times of writing. Therefore, the write operation and the verify operation of multi-value data can be concurrently executed on a plurality of memory cells, allowing the multi-value data to be written at high speed. Furthermore, the specified write voltage Vneg is applied to the word line regardless of the values of the multi-value data to be written, and therefore, the gate disturbance of the memory cells connected to the same word line can be reduced.

When the latch nodes Q0# and Q1# representing the input multi-value data stored in the latch circuits Latch0 and Latch1 coincide with the inverted values S0 and S1 of the sense nodes S0# and S1# representing the multi-value data read from the memory cell CELL0 by the sense amplifiers SA0 and SA1 as a consequence of the aforementioned operations of (2) reading from memory cell, (3) applying voltage to bit line and (4) applying write pulse, then the bit line voltage generating circuit 1 puts the bit line BLn of the selected memory cell CELL0 into the open state. Therefore, even when writing of another memory cell connected to the word line WL0 is executed, the memory cell in which the input multi-value data is correctly written is not further subjected to the write operation, and therefore, the input multi-value data can be infallibly written into the memory cell.

The bit line voltage generating circuit 1 outputs the specified voltage to be applied to the bit line connected to the memory cell until the input multi-value data is correctly written into the memory cell and the latch nodes Q0# and Q1# representing the input multi-value data stored in the latch circuits Latch0 and Latch1 coincide with the inverted values S0 and S1 of the sense nodes S0# and S1# representing the multi-value data read from the memory cell CELL0 by the sense amplifiers SA0 and SA1 as a consequence of the aforementioned operations of (2) reading from memory cell, (3) applying voltage to bit line and (4) applying write pulse. Therefore, even when the operations of (2) reading from memory cell, (3) applying voltage to bit line and (4) applying write pulse are repeated, there is no delay of output of the bit line voltage generating circuit 1, allowing a write operation to be executed at high speed.

Although the above embodiment employs the bit line voltage generating circuit 1 shown in FIG. 1, the bit line voltage generating circuit is not limited to this, and it is merely required to provide a circuit for generating the voltages shown in Table 1.

Figure 5:
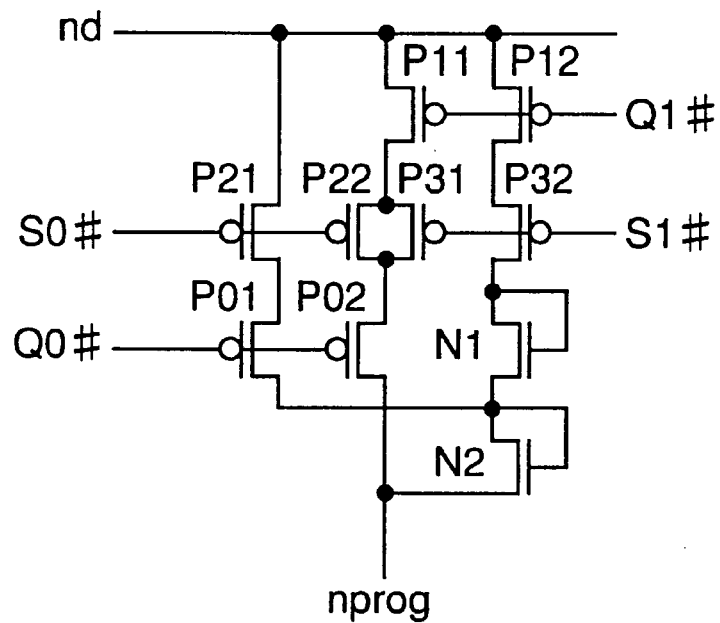
FIG. 5 is a circuit diagram showing another example of the bit line voltage generating circuit of the above nonvolatile semiconductor storage device.

For example, as shown in FIG. 5, there may be provided a circuit in which the same components as those of the bit line voltage generating circuit 1 shown in FIG. 1 are employed with different connections between the components. That is, the bit line voltage generating circuit shown in FIG. 5 has a construction in which the sense node S0# of the sense amplifier SA0 shown in FIG. 2 is connected to the gates of the p-channel transistors P21 and P22. The bit line voltage supply line nd is connected to the drain of the p-channel transistor P21. The latch node Q1# of the latch circuit Latch1 shown in FIG. 1 is connected to the gates of the p-channel transistors P11 and P12. The bit line voltage supply line nd is connected to the drains of the p-channel transistors P11 and P12. The source of the p-channel transistor P11 is connected to the drain of the p-channel transistor P22. The sense node S1# of the sense amplifier SA1 shown in FIG. 2 is connected to the gates of the p-channel transistors P31 and P32. The source of the p-channel transistor P12 is connected to the drain of the p-channel transistor P32, while the p-channel transistors P22 and P31 are connected in parallel with each other. The latch node Q0# of the latch circuit Latch0 shown in FIG. 1 is connected to the gates of the p-channel transistors P01 and P02. The source of the p-channel transistor P21 is connected to the drain of the p-channel transistor P01, while the source of the p-channel transistor P22 is connected to the drain of the p-channel transistor P02. Then, the source of the p-channel transistor P32 is connected to the drain of the n-channel transistor N1 whose gate and drain are connected to each other, while the source of the n-channel transistor N1 is connected to the source of the p-channel transistor P01. Further, the source of the n-channel transistor N1 is connected to the drain of the n-channel transistor N2 whose gate and drain are connected to each other, while the source of the n-channel transistor N2 is connected to the source of the p-channel transistor P02. The source of the n-channel transistor N2 is made to serve as the output node nprog of the bit line voltage generating circuit.

Figure 6:
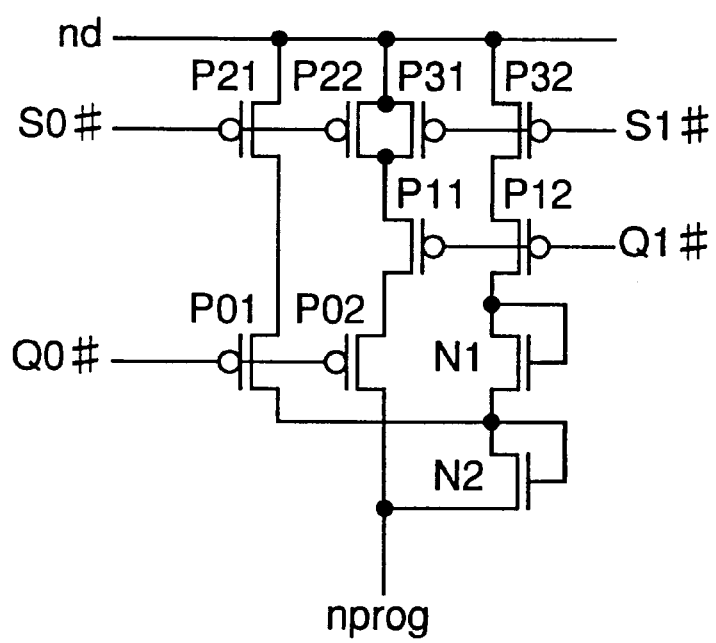
FIG. 6 is a circuit diagram showing yet another example of the bit line voltage generating circuit of the above nonvolatile semiconductor storage device.

As shown in FIG. 6, there may be provided another circuit in which the same components as those of the bit line voltage generating circuit 1 shown in FIG. 1 are employed with different connections between the components. This bit line voltage generating circuit has a construction in which the sense node S0# of the sense amplifier SA0 shown in FIG. 2 is connected to the gates of the p-channel transistors P21 and P22, while the bit line voltage supply line nd is connected to the drains of the p-channel transistors P21 and P22. The sense node S1# of the sense amplifier SA1 shown in FIG. 2 is connected to the gates of the p-channel transistors P31 and P32, while the bit line voltage supply line nd is connected to the drain of the p-channel transistor P32. The p-channel transistor P22 and the p-channel transistor P31 are connected in parallel with each other. The latch node Q1# of the latch circuit Latch1 shown in FIG. 1 is connected to the gates of the p-channel transistors P11 and P12. The source of the p-channel transistor P32 is connected to the drain of the p-channel transistor P12, while the source of the p-channel transistor P31 is connected to the drain of the p-channel transistor P11. The latch node Q0# of the latch circuit Latch0 shown in FIG. 1 is connected to the gates of the p-channel transistors P01 and P02. The source of the p-channel transistor P21 is connected to the drain of the p-channel transistor P01, while the source of the p-channel transistor P11 is connected to the drain of the p-channel transistor P02. The source of the p-channel transistor P12 is connected to the drain of the n-channel transistor N1 whose gate and drain are connected to each other, while the source of the n-channel transistor N1 is connected to the source of the p-channel transistor P01. Further, the source of the n-channel transistor N1 is connected to the drain of the n-channel transistor N2 whose gate and drain are connected to each other, while the source of the n-channel transistor N2 is connected to the source of the p-channel transistor P02. The source of the n-channel transistor N2 is made to serve as the output node nprog of the bit line voltage generating circuit.

The above bit line voltage generating circuit can also be implemented by a circuit constructed of only n-channel transistors.

Figure 7:
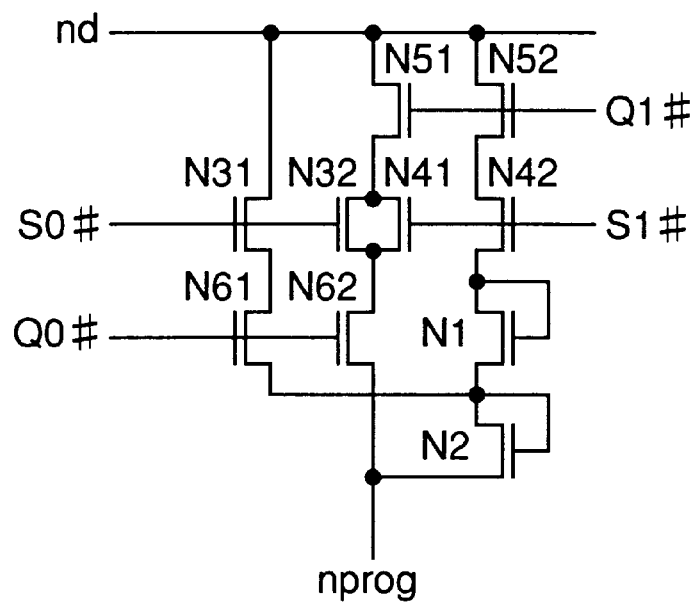
FIG. 7 is a circuit diagram showing an example in which the bit line voltage generating circuit of FIG. 5 is constructed of only n-channel transistors.

That is, as shown in FIG. 7, there may be provided a circuit in which all the p-channel transistors P01 through P32 of the bit line voltage generating circuit of FIG. 5 are replaced by n-channel transistors N31 through N62 and the n-channel transistors N1 and N2 remain unchanged.

Figure 8:
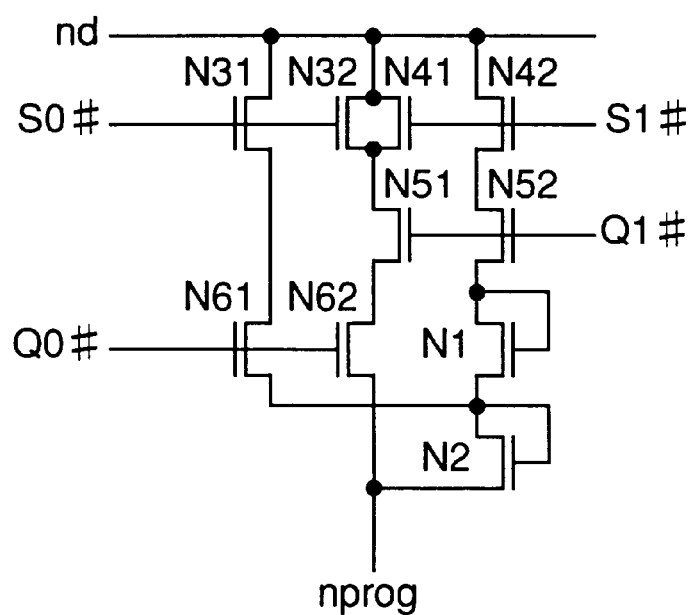
FIG. 8 is a circuit diagram showing an example in which the bit line voltage generating circuit of FIG. 6 is constructed of only n-channel transistors.

As shown in FIG. 8, there may be provided a circuit in which all the p-channel transistors P01 through P32 of the bit line voltage generating circuit of FIG. 6 are replaced by n-channel transistors N31 through N62 and the n-channel transistors N1 and N2 remain unchanged.

Figure 9:
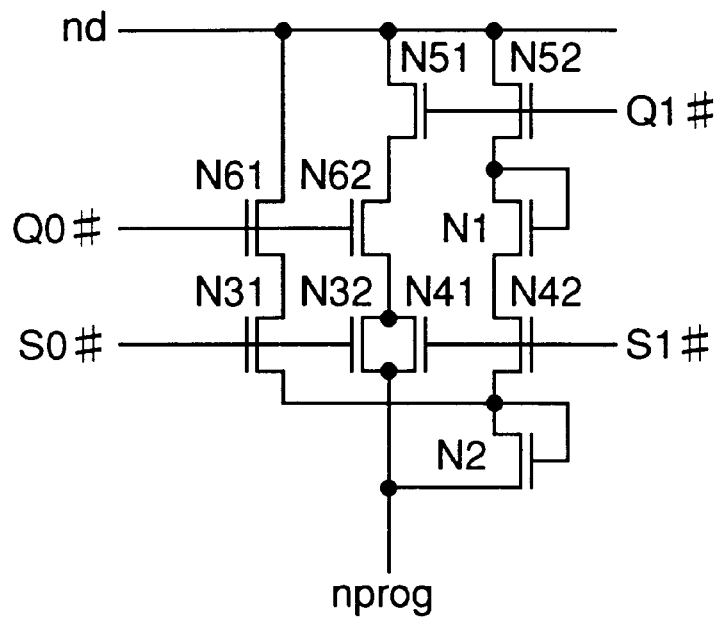
FIG. 9 is a circuit diagram showing an example in which the bit line voltage generating circuit of FIG. 1 is constructed of only n-channel transistors.

As shown in FIG. 9, there may be provided a circuit in which all the p-channel transistors P01 through P32 of the bit line voltage generating circuit of FIG. 1 are replaced by n-channel transistors N31 through N62 and the n-channel transistors N1 and N2 remain unchanged.

Figure 10:
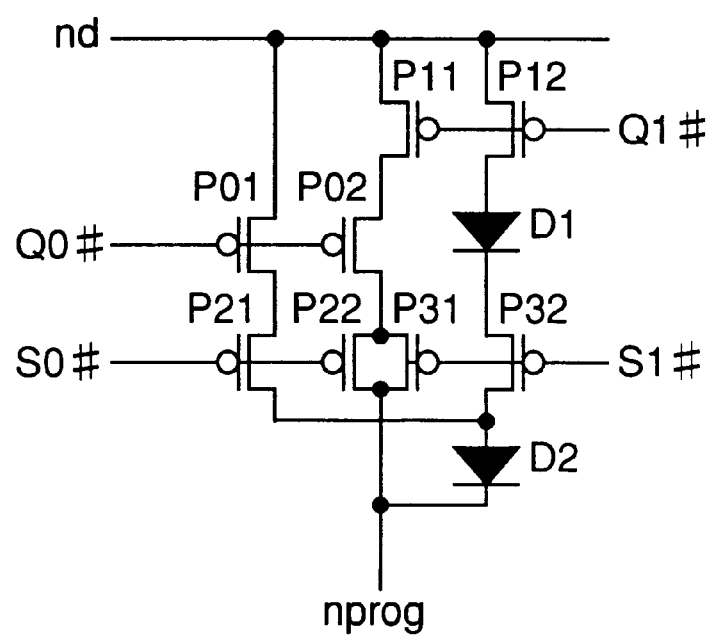
FIG. 10 is a circuit diagram showing a bit line voltage generating circuit obtained by constructing the bit line voltage generating circuit of FIG. 1 of MOS diodes instead of n-channel transistors.

Furthermore, as shown in FIG. 10, there may be provided a circuit in which the n-channel transistors N1 and N2 of the bit line voltage generating circuit 1 of FIG. 1 are replaced by MOS diodes D1 and D2.

Although the above embodiment employs the NOR system as a memory array construction, this invention may be applied to the array constructions of the generic NAND type, the AND type, the DINOR type and the so-called virtual GND type. In regard to the memory cell, this invention can be applied to all sorts of nonvolatile semiconductor storage devices such as a flash memory including the split-gate type.

Although the 4-value (2-bit) data is stored in one memory cell in the above embodiment, the data to be stored in one memory cell is not limited to this, and this invention may be applied to a nonvolatile semiconductor storage device in which 8-value (3-bit) data is stored in one memory cell. In this case, a multi-value sense amplifier for reading the 8-value data is employed.

The Invention being thus described, it will be obvious that the same may be obvious that the same may be varied in many ways. Such variations are not be regarded as a departure form the sprit and scope of the invention, and all such modifications as would be obvious to one skilled in the art are intended to be included within the scope of the following claims.

What is claimed is:

1. A nonvolatile semiconductor storage device comprising:

a plurality of non-volatile memory cells connected to bit lines and word lines;

a plurality of latch circuits for storing therein an input multi-value data to be written into a memory cell selected by a bit line and a word line;

a plurality of multi-value sense amplifiers for reading a multi-value data written in the memory cell by applying a specified read voltage to the word line; and a bit line voltage generating circuit [for], based on the input multi-value data stored in the latch circuits and the input multi-value data read from the memory cell by the multi-value sense amplifiers, for applying a specified voltage to the bit line connected to the memory cell for writing the input multi-value data into the memory cell so as to concurrently execute a write operation and a verify operation of the input multi-value data in the memory cell.

2. A nonvolatile semiconductor storage device as claimed in claim 1, wherein the bit line voltage generating circuit puts the bit line connected to the memory cell into an open state when the input multi-value data stored in the latch circuits coincides with a value based on the multi-value data read from the memory cell by the multi-value sense amplifiers.

3. A nonvolatile semiconductor storage device as claimed in claim 1, wherein the bit line voltage generating circuit continues to output the specified voltage for writing the input multi-value data into the memory cell until the input multi-value data is correctly written into the memory cell and the input multi-value data stored in the latch circuits coincides with a value based on the multi-value data read from the memory cell by the multi-value sense amplifiers.

4. A writing method for a nonvolatile semiconductor storage device having a plurality of non-volatile memory cells connected to bit lines and word lines, the method comprising:

a first step of storing an input multi-value data to be written in a memory cell selected by a bit line and a word line into a plurality of latch circuits;

a second step of reading a multi-value data written in the memory cell by a plurality of multi-value sense amplifiers by applying a specified read voltage to the word line;

a third step, based on the input multi-value data stored in the latch circuits and the multi-value data written in the memory cell read by the multi-value sense amplifiers, of applying a specified voltage by a bit line voltage generating circuit to the bit line connected to the memory cell for writing the input multi-value data into the memory cell so as to concurrently execute a write operation and a verify operation of the input multi-value data in the memory cell; and a fourth step of writing the input multi-value data into the memory cell by applying a specified write voltage to the word line in a state in which the specified voltage is applied to the bit line by the bit line voltage generating circuit, wherein the second, third and fourth steps are repeated until the input multi-value data stored in the latch circuits coincides with a value based on the multi-value data read from the memory cell by the multi-value sense amplifiers.

* * * * *